(12) United States Patent
Wu et al.

(10) Patent No.: US 11,521,480 B1
(45) Date of Patent: Dec. 6, 2022

(54) INTRUSION DETECTION APPARATUS AND METHOD THEREOF

(71) Applicant: Wiwynn Corporation, New Taipei (TW)

(72) Inventors: Chi Ming Wu, New Taipei (TW); Yu Shu Kao, New Taipei (TW); Hsieh Ju Tsai, New Taipei (TW); Ye Sheng Lin, New Taipei (TW); Po Jung Lin, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 17/458,578

(22) Filed: Aug. 27, 2021

(30) Foreign Application Priority Data

Jun. 30, 2021 (TW) ................................ 110123910

(51) Int. Cl.
*G08B 29/18* (2006.01)
*G08B 29/04* (2006.01)
*H03K 3/3565* (2006.01)

(52) U.S. Cl.
CPC ........... *G08B 29/181* (2013.01); *G08B 29/04* (2013.01); *H03K 3/3565* (2013.01)

(58) Field of Classification Search
CPC ..... G08B 29/181; G08B 29/04; H03K 3/3565
See application file for complete search history.

(56) References Cited

U.S. PATENT DOCUMENTS

| 3,978,479 | A | * | 8/1976 | Schmitz | G08B 19/00 |
| | | | | | 340/529 |
| 4,642,612 | A | * | 2/1987 | Crump | G08B 13/00 |
| | | | | | 340/541 |
| 4,672,365 | A | * | 6/1987 | Gehman | G08B 19/00 |
| | | | | | 375/243 |
| 4,724,425 | A | * | 2/1988 | Gerhart | G08B 25/10 |
| | | | | | 327/31 |
| 4,783,607 | A | * | 11/1988 | Hsieh | H03K 3/3565 |
| | | | | | 326/71 |

(Continued)

FOREIGN PATENT DOCUMENTS

| CN | 101875341 | 11/2010 |
| TW | I325535 | 6/2010 |
| TW | I326823 | 7/2010 |

(Continued)

OTHER PUBLICATIONS

Office Action of Taiwan Counterpart Application, dated Mar. 11, 2022, pp. 1-8.

*Primary Examiner* — John A Tweel, Jr.
(74) *Attorney, Agent, or Firm* — JCIPRNET

(57) ABSTRACT

An intrusion detection apparatus and method thereof are provided. The intrusion detection apparatus includes a status detection device, a front-end signal processor, a delay device, and a signal sampler. The status detection device is configured to generate an indicating signal according to an opened status of the case. The front-end signal processor receives the indicating signal and performs a noise filtering function on the indicating signal so as to generate a processed indicating signal. The delay device delays the processed indicating signal to generate a delayed indicating signal. The signal sampler samples the processed indicating signal to generate a detection result according to the delayed indicating signal.

13 Claims, 4 Drawing Sheets

(56) References Cited

U.S. PATENT DOCUMENTS 7,936,271 B2 * 5/2011 Karr ................ G01S 15/876
                                                                340/539.16

FOREIGN PATENT DOCUMENTS

| | | |
|---|---|---|
| TW | 201118554 | 6/2011 |
| TW | I618380 | 3/2018 |
| TW | 202023191 | 6/2020 |

* cited by examiner

INTRUSION DETECTION APPARATUS AND METHOD THEREOF

CROSS-REFERENCE TO RELATED APPLICATION

This application claims the priority benefit of Taiwan application serial no. 110123910, filed on Jun. 30, 2021. The entirety of the above-mentioned patent application is hereby incorporated by reference herein and made a part of this specification.

BACKGROUND

Technology Field

The disclosure relates to an intrusion detection apparatus and method thereof, and more particularly to an intrusion detection apparatus and method thereof with low power consumption.

Description of Related Art

In the current technical field, the intrusion mechanism of an electronic device means that when the case of the electronic device is moved or opened, the detection device may detect and record the movement or opening behavior of the case and record it to report to the system for analysis to make sure whether the electronic device is illegally intruded. This mechanism requires long-term work, long-term backup power, and instant return function.

In the conventional technical field, performing intrusion detection may be executed through the register of the platform controller hub (PCH) or the board management controller (BMC) in the computer device along with an intrusion detection circuit. This method may be effectively executed only when the platform controller hub or the baseboard management controller is booted, which requires a large power consumption and may not effectively detect the occurrence of intrusions in real time.

SUMMARY

In view of this, the disclosure provides an intrusion detection apparatus and method thereof capable of operating with low power consumption.

An embodiment of the disclosure discloses an intrusion detection apparatus, and the intrusion detection apparatus includes a status detection device, a front-end signal processor, a delay device, and a signal sampler. The status detection device is configured to generate an indicating signal according to an opened status. The front-end signal processor is coupled to the status detection device. The front-end signal processor is configured to receive the indicating signal and perform a noise filtering function on the indicating signal so as to generate a processed indicating signal. The delay device is coupled to the front-end signal processor and configured to delay the processed indicating signal so as to generate a delayed indicating signal. The signal sampler is coupled to the front-end signal processor and the delay device. The signal sampler is configured to sample the processed indicating signal according to the delayed indicating signal so as to generate a detection result.

An embodiment of the disclosure discloses an intrusion detection method, and the intrusion detection method is adapted for an intrusion detection apparatus. The method includes the following steps. An indicating signal is generated according to an opened status of the intrusion detection apparatus. A noise filtering function is performed on the indicating signal to generate a processed indicating signal. The processed indicating signal is delayed to generate a delayed indicating signal. The processed indicating signal is sampled according to the delayed indicating signal, and a detection result is generated.

In summary, the intrusion detection apparatus of the disclosure generates an indicating signal based on an opened status through the detection status detection device. Furthermore, through a noise filtering function and a delay, the signal sampler may sample the processed indicating signal according to the delayed indicating signal to generate a detection result. Accordingly, the intrusion detection apparatus of the disclosure may complete the intrusion detection by using a small number of circuit elements without waking up the controller of the system. Moreover, since the intrusion detection apparatus may operate under low power consumption, it may be ensured that the detection result is actually generated.

DESCRIPTION OF THE EMBODIMENTS

Figure 1:
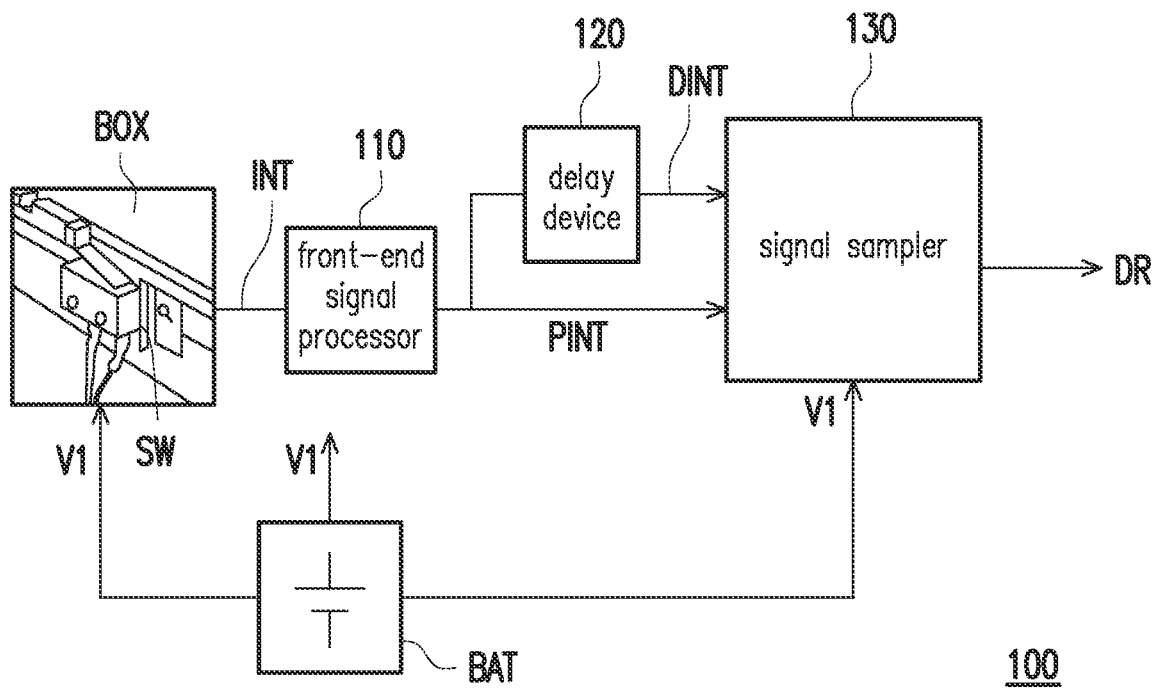
FIG. 1 is a schematic view of an intrusion detection apparatus according to an embodiment of the disclosure.

Referring to FIG. 1, FIG. 1 is a schematic view of an intrusion detection apparatus according to an embodiment of the disclosure. An intrusion detection apparatus 100 is adapted for an electronic device (not shown). The intrusion detection apparatus 100 includes a status detection device SW, a front-end signal processor 110, a delay device 120, and a signal sampler 130. The status detection device SW includes a switch, a signal detector, a distance detector, or a light sensor. For example, the status detection device SW may be a switch and is disposed on a case BOX of the electronic device. The status detection device SW may generate an indicating signal INT according to the opened status of the case BOX or the opened status of the status detection device SW itself. The indicating signal INT is used to indicate whether the case BOX is forcibly opened. On the other hand, the opened status may be generated in response to the status when the electronic device or the intrusion detection apparatus 100 is moved. That is, the status detection device SW may generate the indicating signal INT according to a distance change when the electronic device or the intrusion detection apparatus 100 is moved. Alternatively, the status detection device SW may generate the indicating signal INT according to a light change when the electronic device or the intrusion detection apparatus 100 is moved. The front-end signal processor 110 is coupled to the status detection device SW. The front-end signal processor 110 is configured to receive the indicating signal INT. The front-end signal processor 110 performs a noise filtering function on the indicating signal INT to generate a processed indicating signal PINT. The delay device 120 is coupled to the front-end signal processor 110. The delay device 120 is configured to delay the processed indicating signal PINT so as to generate a delayed indicating signal DINT. Moreover, the signal sampler 130 is coupled to the front-end signal processor 110 and the delay device 120. The signal sampler 130 is configured to sample the processed indicating signal PINT so as to generate a detection result DR according to the delayed indicating signal DINT.

Referring to operation details, in the embodiment of the disclosure, the status detection device SW, the front-end signal processor 110, the delay device 120, and the signal sampler 130 receive power V1 supplied by a battery BAT as operating power. When the case BOX is forcibly opened, the status detection device SW may be turned on or off, and the indicating signal INT is generated correspondingly. In an embodiment, the indicating signal INT may initially be a first logic value. When the case BOX is forcibly opened, the status detection device SW may change the indicating signal INT into a second logic value, and the first logic value is different from the second logic value.

When the status detection device SW is switched, a bounce phenomenon occurs, so the generated indicating signal INT may generate a certain voltage instability phenomenon. The front-end signal processor 110 is configured to receive the indicating signal INT and perform a noise filtering function on the indicating signal INT to generate the processed indicating signal PINT. Specifically, the front-end signal processor 110 performs debounce on the indicating signal INT so as to perform the noise filtering function on the indicating signal INT.

Furthermore, the delay device 120 is configured to delay the processed indicating signal PINT so as to generate the delayed indicating signal DINT. The delay device 120 may delay the processed indicating signal PINT according to a delay setting value for the processed indicating signal PINT. The delay setting value may be fixed or variable. Through the delay of the delay device 120, the processed indicating signal PINT and the delayed indicating signal DINT may have a certain degree of phase difference, that is, the processed indicating signal PINT and the delayed indicating signal DINT have different phases.

In an embodiment, the delay device 120 and the signal sampler 130 both receive the processed indicating signal PINT generated by the front-end signal processor 110, and the signal sampler 130 may sample the processed indicating signal PINT to generate the detection result DR according to the delayed indicating signal DINT. Since the phase of the delayed indicating signal DINT lags behind the processed indicating signal PINT, through sampling the processed indicating signal PINT according to the delayed indicating signal DINT, sampling the part where the voltage of the processed indicating signal PINT is unstable may be prevented. Therefore, the signal sampler 130 may accurately generate the correct detection result DR.

Note that the bouncing phenomenon generated by each electronic component of the status detection device SW may be different. Therefore, the signal delay effect generated by the delay device 120 in the embodiment of the disclosure may be adjusted. By enabling the delay device 120 to dynamically adjust the delay between the delayed indicating signal DINT and the processed indicating signal PINT, it may reduce the probability of the incorrect detection result DR generated by the signal sampler 130 due to the interference of noise (including the noise generated by the bouncing phenomenon of the status detection device SW) and improve the accuracy of the detection result DR.

Moreover, in an embodiment, the intrusion detection apparatus 100 only needs to supply power through the battery BAT and may complete the intrusion detection under the premise of low power consumption, and the signal sampler 130 may latch the status of the detection result DR. Meanwhile, the basic input/output system (BIOS) of the platform controller hub of the electronic device or the baseboard management controller is not booted. Then, after the firmware of the electronic device is booted, for example, the BIOS of the platform controller hub of the electronic device may be effectively provided to the electronic device for reading, and no loss of detection caused by the unpowered electronic device occurs.

In an embodiment, the battery BAT may be a rechargeable battery to maintain the operation of the intrusion detection apparatus 100 for a long time. Moreover, the battery BAT may be the battery of the intrusion detection apparatus 100, the battery of the platform controller hub or the baseboard management controller of the electronic device, or a backup power source.

Figure 2A:
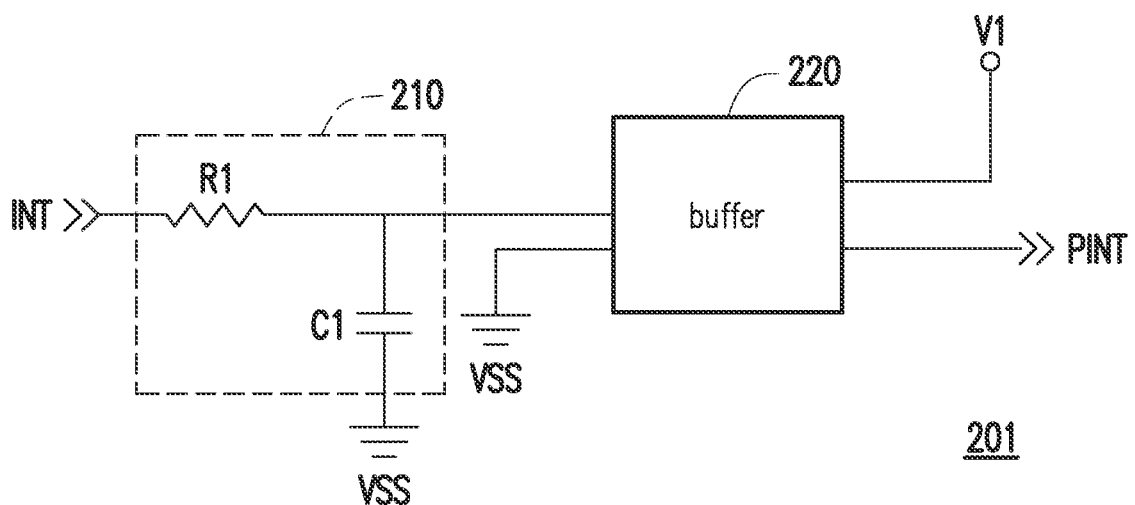
FIG. 2A is a schematic circuit diagram of a front-end signal processor of an intrusion detection apparatus according to an embodiment of the disclosure.

Referring to FIG. 2A, in the following paragraphs, FIG. 2A is a schematic circuit diagram of a front-end signal processor of an intrusion detection apparatus according to an embodiment of the disclosure. A front-end signal processor 201 includes a filter 210 and a buffer 220. The filter 210 may be a low-pass filter and include a resistor R1 and a capacitor C1. The first terminal of the resistor R1 is configured to receive the indicating signal INT, and the second terminal of the resistor R1 is coupled to the first terminal of the capacitor C1. The second terminal of the capacitor C1 receives a reference ground voltage VSS. The filter 210 is configured to perform a filtering function on the indicating signal INT and transmit the filtered output signal to the buffer 220.

The buffer 220 is coupled to the output terminal of the filter 210. The buffer 220 is configured to generate the processed indicating signal PINT according to the output signal of the filter 210. In an embodiment, the buffer 220 receives the power V1 as operating power. The power V1 may come from a battery as shown in the embodiment of FIG. 1. The buffer 220 may perform shaping on the output signal of the filter 210 and generate the processed indicating signal PINT as a square wave. To further reduce the noise of the processed indicating signal PINT, the buffer 220 may be implemented by using a Schmitt trigger, but the disclosure is not limited thereto.

Figure 2B:
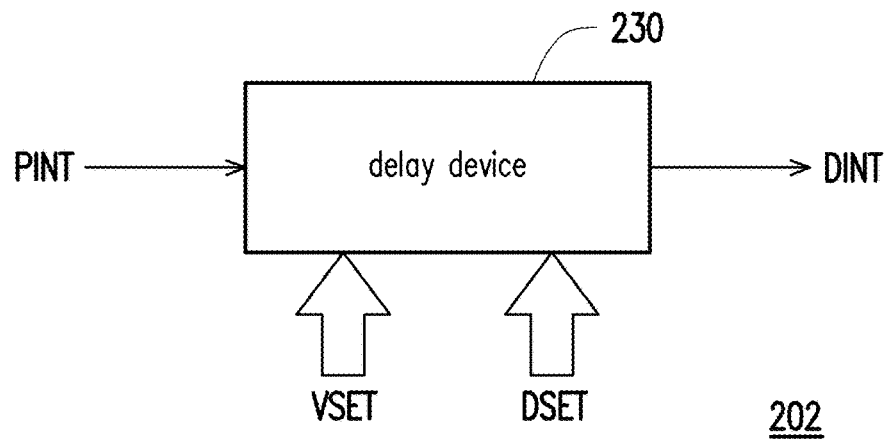
FIG. 2B is a schematic view of a delay device of an intrusion detection apparatus according to an embodiment of the disclosure.

Referring to FIG. 2B, in the following paragraphs, FIG. 2B is a schematic view of a delay device of an intrusion detection apparatus according to an embodiment of the disclosure. The delay device 202 receives the processed indicating signal PINT, a delay setting value DSET and threshold voltage setting information VSET. In an embodiment, the delay device 202 may delay the processed indicating signal PINT according to the delay setting value DSET so as to generate the delayed indicating signal DINT. The delay device 202 may set a rising threshold voltage and a falling threshold voltage according to the threshold voltage setting information VSET. The delay unit 202 may compare the processed indicating signal PINT with the rising threshold voltage and the falling threshold voltage so as to generate the delayed indicating signal DINT.

In an embodiment, both the delay setting value DSET and the threshold voltage setting information VSET may be programmable information and not necessarily fixed values.

Figure 2C:
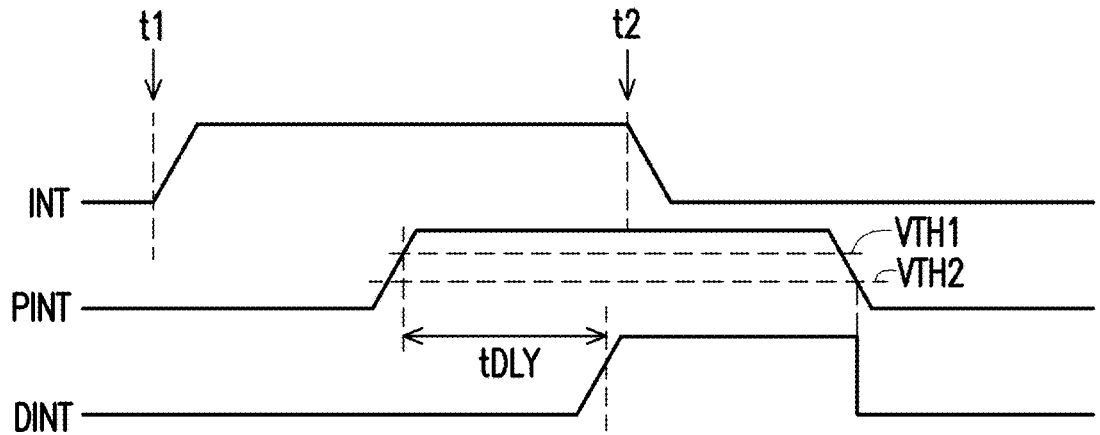
FIG. 2C illustrates signal waveforms generated by an intrusion detection apparatus according to an embodiment of the disclosure.

Referring to FIG. 2A, FIG. 2B, and FIG. 2C altogether, FIG. 2C illustrates signal waveforms generated by an intrusion detection apparatus according to an embodiment of the disclosure. In FIG. 2C, at time t1, the case of the electronic device is opened. Through the status detection device SW, the indicating signal INT is pulled up to the first logic value (e.g., logic 1) at the time t1. At time t2, the case of the electronic device is closed. Through the status detection device SW, the indicating signal INT is pulled down to the second logic value (e.g., logic 0) at the time t2.

The filter 210 and the buffer 220 in the front-end signal processor 201 respectively perform filtering and shaping on the indicating signal INT and generate the processed indicating signal PINT. The phase of the processed indicating signal PINT is relatively delayed compared with the phase of the indicating signal INT.

On the other hand, the delay device 202 sets a time delay tDLY, a rising threshold voltage VTH1, and a falling threshold voltage VTH2 according to the delay setting value DSET and the threshold voltage setting information VSET. The delay device 202 delays the processed indicating signal PINT for the time delay tDLY and performs signal processing on the processed indicating signal PINT according to the rising threshold voltage VTH1 and the falling threshold voltage VTH2 to generate the delayed indicating signal DINT. In an embodiment, for example, the time delay tDLY may range from 100 milliseconds to 350 milliseconds, but the disclosure is not limited thereto.

Figure 2D:
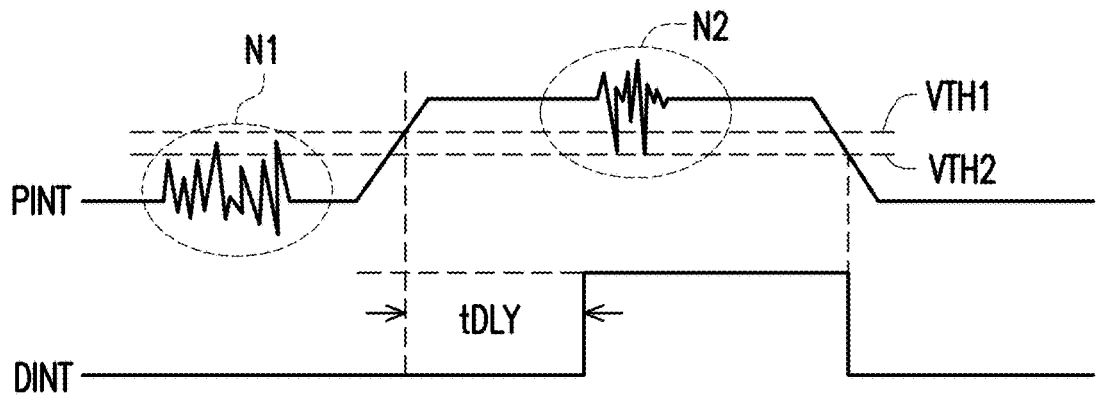
FIG. 2D is a schematic view illustrating the setting of the voltage threshold of the delay device in an intrusion detection apparatus according to the embodiment of the disclosure.

For the operation details of setting the rising threshold voltage VTH1 and the falling threshold voltage VTH2, refer to FIG. 2D for the schematic view of the setting of the voltage threshold of the delay device in an intrusion detection apparatus according to an embodiment of the disclosure. In FIG. 2D, there may be a certain degree of noise N1 and N2 carried by the processed indicating signal PINT, the noise N1 is distributed in the part where the processed indicating signal PINT is logic 0 after processing, and the noise N2 is distributed in the part where the processed indicating signal PINT is logic 1. That is, the noise N2 is greater than the noise N1. To filter out the noise N1 and N2, in an embodiment, the falling threshold voltage VTH2 may be set to be greater than the voltage distribution range of the noise N1, and the rising threshold voltage VTH1 may be set to be less than the voltage distribution range of the noise N2. Accordingly, the delayed indicating signal DINT generated by the delay device 230 is not interfered by the noise N1 and N2 and is maintained at the correct logical value.

Figure 3:
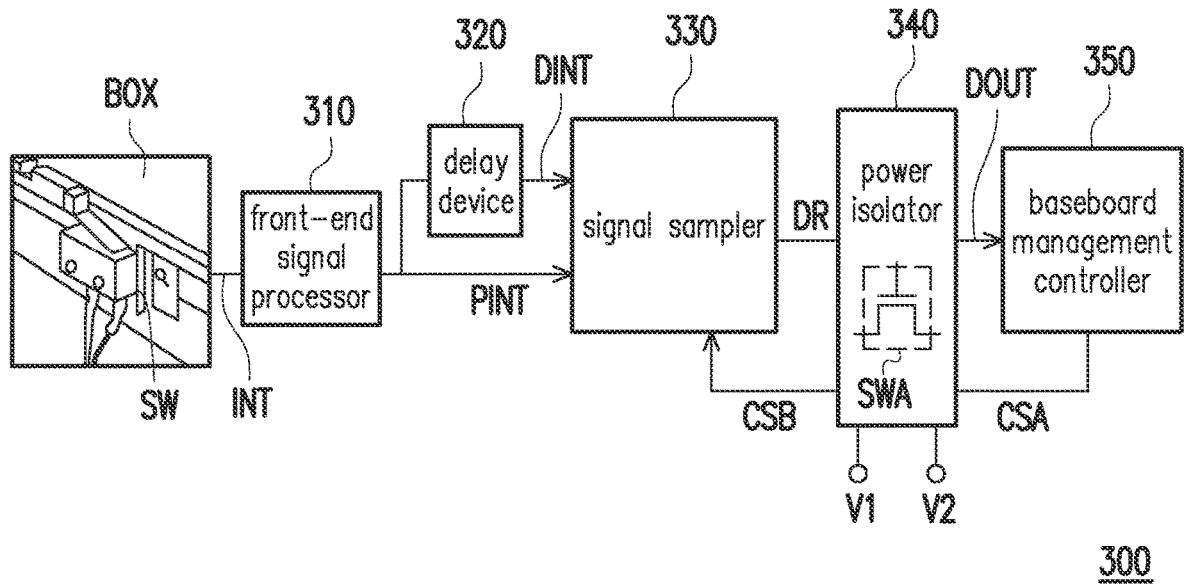
FIG. 3 is a schematic view of an intrusion detection apparatus according to an embodiment of the disclosure.

Referring to FIG. 3, in the following paragraphs, FIG. 3 is a schematic view of an intrusion detection apparatus according to an embodiment of the disclosure. An intrusion detection apparatus 300 is adapted for an electronic device. The intrusion detection apparatus 300 includes a status detection device SW, a front-end signal processor 310, a delay device 320, a signal sampler 330, and a power isolator 340. The power isolator 340 may be coupled to a baseboard management controller 350 in the electronic device.

In an embodiment, the status detection device SW may generate the indicating signal INT according to the opened status of the case BOX. The indicating signal INT is used to indicate whether the case BOX is forcibly opened. The front-end signal processor 310 is coupled to the status detection device SW. The front-end signal processor 310 receives the indicating signal INT. The front-end signal processor 310 performs a noise filtering function on the indicating signal INT to generate the processed indicating signal PINT. The delay device 320 is coupled to the front-end signal processor 310. The delay device 320 is configured to delay the processed indicating signal PINT so as to generate the delayed indicating signal DINT. Moreover, the signal sampler 330 is coupled to the front-end signal processor 310 and the delay device 320. The signal sampler 330 samples the processed indicating signal PINT so as to generate the detection result DR according to the delayed indicating signal DINT.

The power isolator 340 is coupled between the signal sampler 330 and the baseboard management controller 350. In an embodiment, the power isolator 340 receives the power V1 and the power V2 and has two corresponding sides. The first side of the power isolator 340 is coupled to the signal sampler 330, and the second side of the power isolator 340 is coupled to the baseboard management controller 350. The power isolator 340 receives the detection result DR based on the power V1 and generates a detection output signal DOUT based on the power V2 according to the detection result DR. The power isolator 340 also provides the detection output signal DOUT to the baseboard management controller 350, and the baseboard management controller 350 performs operations based on the power V2.

In an embodiment, the power V1 may be provided by the battery BAT as shown in the embodiment of FIG. 1. The power V2 may be the standby power of the electronic device. The power isolator 340 may perform power isolation through a built-in transistor switch SWA, where the transistor switch SWA may be controlled by the power V2 to perform operations. Meanwhile, in other embodiments of the disclosure, the power isolator 340 may also use other components, such as an optical coupling component, to complete the power isolation. However, power isolation circuits well known to those with ordinary knowledge in the art may be used to implement the power isolator 340 of the disclosure without certain restrictions.

In an embodiment, when an intrusion occurs, the signal sampler 330 may temporarily store the generated detection result DR. Meanwhile, the baseboard management controller 350 of the electronic device does not need to be booted, and the detection result DR does not disappear. After the baseboard management controller 350 is booted, the signal sampler 330 may provide the baseboard management controller 350 with the generated detection result DR through the power isolator 340, so that the baseboard management controller 350 may read that the electronic device has been intruded. Correspondingly, in an embodiment, the baseboard management controller 350 may transmit a clear signal CSA, and correspondingly transmit a clear signal CSB to the signal sampler 330 through the power isolator 340 to clear the detection result DR.

Figure 4:
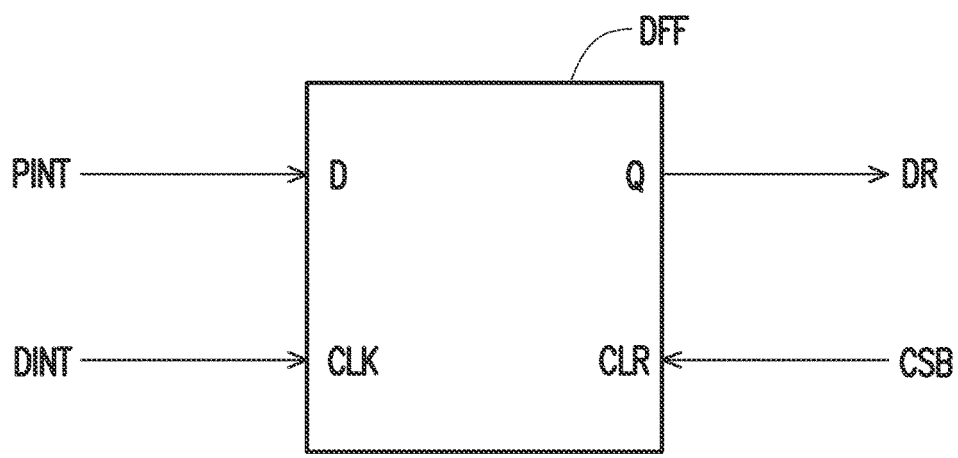
FIG. 4 is a schematic view of an implementation of a signal sampler in an intrusion detection apparatus according to an embodiment of the disclosure.

Referring to FIG. 4, FIG. 4 is a schematic view of an implementation of a signal sampler in an intrusion detection apparatus according to an embodiment of the disclosure. A signal sampler 400 is a D-type flip-flop DFF. A data terminal D of the D-type flip-flop DFF is used to receive the processed indicating signal PINT. A clock terminal CLK of the D-type flip-flop DFF receives the delayed indicating signal DINT. An output terminal Q of the D-type flip-flop DFF generates the detection result DR. Moreover, the D-type flip-flop DFF also has a clear terminal CLR. The clear terminal CLR of the D-type flip-flop DFF is used to receive the clear signal CSB. The D-type flip-flop DFF clears the detection result DR generated at its output terminal Q according to the clear signal CSB.

Figure 5:
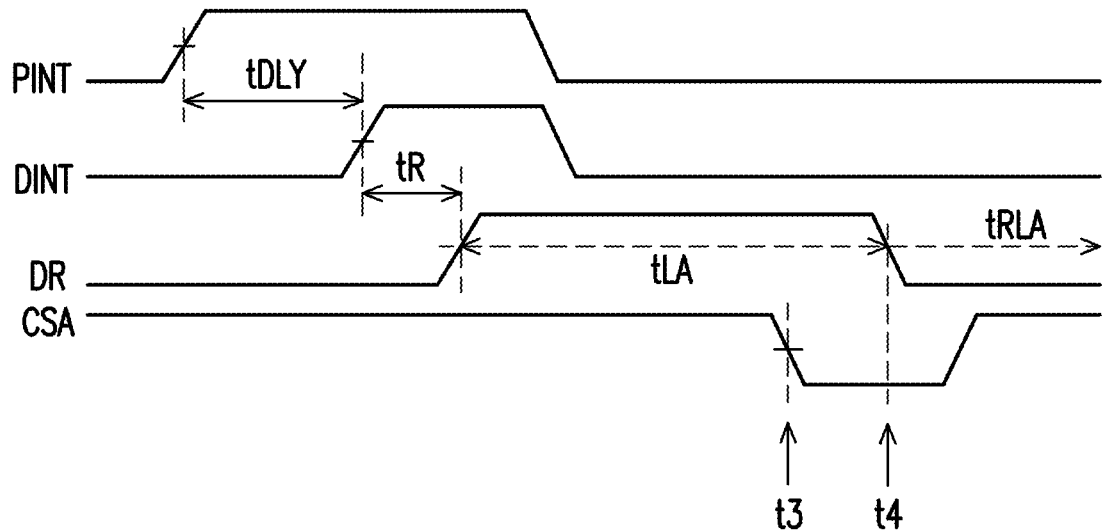
FIG. 5 illustrates signal waveforms of an intrusion detection apparatus according to an embodiment of the disclosure.

Referring to FIG. 5, in the following paragraphs, FIG. 5 illustrates signal waveforms of the intrusion detection apparatus 300 according to an embodiment in FIG. 3 of the disclosure. The signal sampler 330 receives the processed indicating signal PINT and the delayed indicating signal DINT lagging behind the processed indicating signal PINT for the time delay tDLY. The signal sampler 330 samples the processed indicating signal PINT according to the rising edge of the delayed indicating signal DINT, and generates a detection result DR of logic 1 after a response time tR. The detection result DR of logic 1 maintains the latched status at a time interval tLA. After the firmware of the baseboard management controller 350 is booted, the baseboard management controller 350 may read the detection result DR and transmit a clear signal CSA of logic 0 at time t3. The signal sampler 330 clears the detection result DR to logic 0 at time t4 according to the clear signal CSA of logic 0. At a time interval tRLA after the time t4, the latched status of the signal sampler 330 is a released status.

Note that in an embodiment of the disclosure, the logic values of the processed indicating signal PINT, the delayed indicating signal DINT, and the detection result DR when an intrusion occurs may be set by the designer. The illustrations in the embodiments of the disclosure are only exemplary examples and are not intended to limit the scope of the disclosure. Similarly, the signal sampler 330 performs the clearing according to the clear signal CSA of logic 0 or logic 1, which may also be set by the designer without certain restrictions.

Figure 6:
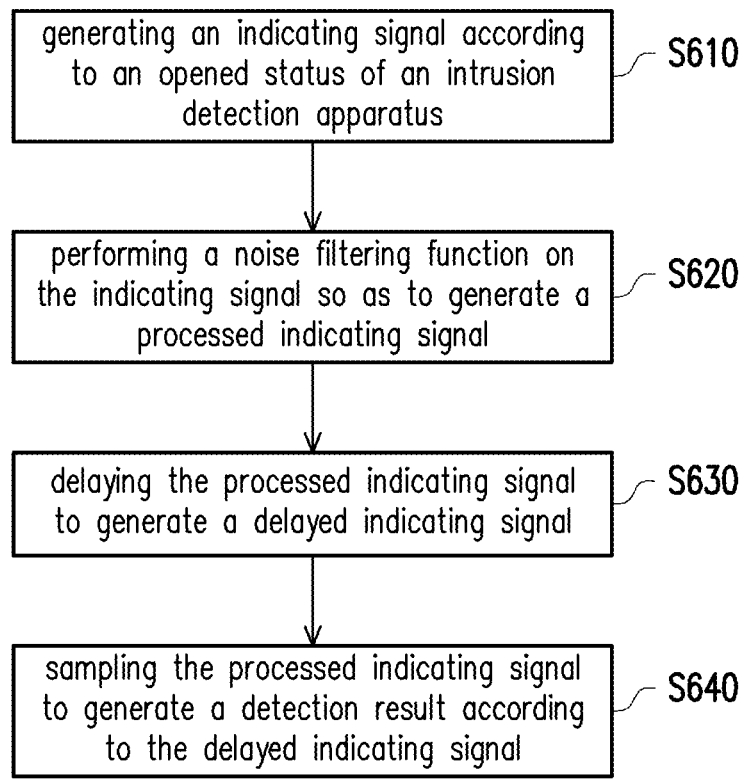
FIG. 6 is a flowchart of an intrusion detection method according to an embodiment of the disclosure.

Referring to FIG. 6, FIG. 6 is a flowchart of an intrusion detection method according to an embodiment of the disclosure. In step S610, an indicating signal is generated according to an opened status of the intrusion detection apparatus. In step S620, a noise filtering function is performed on the indicating signal to generate a processed indicating signal. Moreover, in step S630, the processed indicating signal is delayed to generate a delayed indicating signal. In step S640, a detection result is generated by sampling the processed indicating signal according to the delayed indicating signal.

The implementation details of the steps have been illustrated in detail in the foregoing multiple embodiments and implementations, which are not iterated herein.

In summary, the intrusion detection apparatus of the disclosure only requires a small amount of power and executes the intrusion detection of the electronic device without booting the controller of the system. The intrusion detection of the disclosure performs rigorous debounce on the indicating signal generated by the status detection device of the intrusion detection mechanism. Through the signal sampler, detection results are generated, and the detection results are latched. It is ensured that the detection results are correctly generated and the detection results are effectively read by the electronic device, so that the intrusion phenomenon may not be misjudged or missed, and the security of the system is enhanced effectively.

What is claimed is:

1. An intrusion detection apparatus, comprising:
   a status detection device, configured to generate an indicating signal according to an opened status;
   a front-end signal processor, coupled to the status detection device, configured to receive the indicating signal and perform a noise filtering function on the indicating signal so as to generate a processed indicating signal;
   a delay device, coupled to the front-end signal processor, configured to delay the processed indicating signal so as to generate a delayed indicating signal; and
   a signal sampler, coupled to the front-end signal processor and the delay device, configured to sample the processed indicating signal according to the delayed indicating signal so as to generate a detection result,
   wherein the delay device is configured to delay the processed indicating signal so as to generate the delayed indicating signal according to a delay setting value, wherein the delay setting value is a programmable value,
   wherein the delay device is further configured to set a rising threshold voltage and a falling threshold voltage according to threshold voltage setting information, and the delay device compares the processed indicating signal with the rising threshold voltage and the falling threshold voltage to generate the delayed indicating signal.

2. The intrusion detection apparatus according to claim 1, adapted for an electronic device, wherein the status detection device is disposed on a case of the electronic device and is configured to generate the indicating signal according to the opened status of the case.

3. The intrusion detection apparatus according to claim 1, wherein the front-end signal processor comprises:
   a filter, coupled to the status detection device, configured to filter the indicating signal; and
   a buffer, coupled to an output terminal of the filter, configured to generate the processed indicating signal according to an output signal of the filter.

4. The intrusion detection apparatus according to claim 3, wherein the buffer is a Schmitt trigger.

5. The intrusion detection apparatus according to claim 1, wherein the threshold voltage setting information is programmable information.

6. The intrusion detection apparatus according to claim 1, wherein the signal sampler is a D-type flip-flop, a data terminal of the D-type flip-flop is configured to receive the processed indicating signal, a clock terminal of the D-type flip-flop receives the delayed indicating signal, and an output terminal of the D-type flip-flop is configured to generate the detection result.

7. The intrusion detection apparatus according to claim 6, further comprising:
   a power isolator, comprising a first side and a second side, wherein the first side is coupled to the signal sampler, and the second side is coupled to a baseboard management controller,
   wherein the power isolator is configured to receive the detection result based on first power and generate a detection output signal based on second power according to the detection result, and the power isolator provides the baseboard management controller with the detection output signal.

8. The intrusion detection apparatus according to claim 7, wherein the baseboard management controller is configured to transmit a clear signal to a clear terminal of the D-type flip-flop through the power isolator so as to clear the detection result.

9. An intrusion detection method, adapted for an intrusion detection apparatus, comprising:

generating an indicating signal according to an opened status of the intrusion detection apparatus;
performing a noise filtering function on the indicating signal to generate a processed indicating signal;
delaying the processed indicating signal to generate a delayed indicating signal;
sampling the processed indicating signal according to the delayed indicating signal; and
generating a detection result,
wherein the step of delaying the processed indicating signal to generate the delayed indicating signal comprises:
delaying the processed indicating signal according to a delay setting value; and
generating the delayed indicating signal, wherein the delay setting value is a programmable value,
wherein the step of delaying the processed indicating signal to generate the delayed indicating signal further comprises:
setting a rising threshold voltage and a falling threshold voltage according to threshold voltage setting information;
comparing the processed indicating signal with the rising threshold voltage and the falling threshold voltage; and
generating the delayed indicating signal.

10. The intrusion detection method according to claim 9, wherein the step of performing the noise filtering function on the indicating signal to generate the processed indicating signal comprises:
performing a filtering on the indicating signal; and
generating the processed indicating signal according to an output signal.

11. The intrusion detection method according to claim 9, wherein the threshold voltage setting information is programmable information.

12. The intrusion detection method according to claim 9, further comprising:
receiving the detection result based on first power;
generating a detection output signal based on second power according to the detection result; and
providing the detection output signal.

13. The intrusion detection method according to claim 9, further comprising:
providing a clear signal to clear the detection result.

* * * * *